United States Patent

Schmidt

[11] Patent Number: 5,973,532
[45] Date of Patent: Oct. 26, 1999

[54] CIRCUIT ARRANGEMENT FOR GENERATING TWO SIGNALS STAGGERED IN TIME FROM A CLOCK SIGNAL AND FOR MEASURING THEIR TIME STAGGER

[75] Inventor: Hartmut Schmidt, Weil/Rhein, Germany

[73] Assignee: Endress + Hauser GmbH + Co., Maulburg, Germany

[21] Appl. No.: 08/937,726

[22] Filed: Sep. 25, 1997

[30] Foreign Application Priority Data

Mar. 27, 1997 [DE] Germany ............... 197 13 130

[51] Int. Cl.$^6$ ................... H03H 11/16
[52] U.S. Cl. ............ 327/231; 327/237; 327/243; 327/295; 326/52
[58] Field of Search ............... 327/295, 254, 327/255, 256, 257, 258, 233, 231, 237, 238, 243; 326/96, 52, 54

[56] References Cited

U.S. PATENT DOCUMENTS

| | | | |
|---|---|---|---|
| 3,950,705 | 4/1976 | Fuerherm | 328/108 |
| 4,031,410 | 6/1977 | Kikuchi | 326/60 |
| 4,128,812 | 12/1978 | Pavlis | 328/134 |
| 4,845,728 | 7/1989 | Truong et al. | 377/123 |
| 5,028,824 | 7/1991 | Young | 327/262 |
| 5,544,203 | 8/1996 | Casasanta et al. | 375/376 |

FOREIGN PATENT DOCUMENTS

| | | |
|---|---|---|
| 48-26327 | 4/1973 | Japan . |
| 63-301612 | 12/1988 | Japan . |
| 1149517 | 6/1989 | Japan . |
| 2-135814 | 5/1990 | Japan . |
| 6-112783 | 4/1994 | Japan . |
| 06310999 | 11/1994 | Japan . |

*Primary Examiner*—Timothy P. Callahan
*Assistant Examiner*—An T. Luu
*Attorney, Agent, or Firm*—Bose McKinney & Evans LLP

[57] ABSTRACT

The circuit arrangement for generating two signals staggered in time from a clock signal and for measuring their time stagger receives at its input a clock signal, from which it generates an undelayed signal and a signal delayed relative to the undelayed signal. The generated signals appear at a first and second output of the circuit arrangement, respectively. A delay time measuring arrangement comprises a reversible inverter connected between the input of the circuit arrangement and the first output of the circuit arrangement and a NAND gate. The NAND gate receives at one input the delayed signal and at the other input the output signal of the inverter and furnishes an output signal from which the time stagger existing between the undelayed signal and the delayed signal can be precisely determined. The reversible inverter is switchable by a switching signal between a non-inverting condition in a working phase and an inverting condition in a measuring phase. The reversible inverter may by formed by an XOR gate receiving at one input the clock signal and at the other input the switching signal.

8 Claims, 1 Drawing Sheet

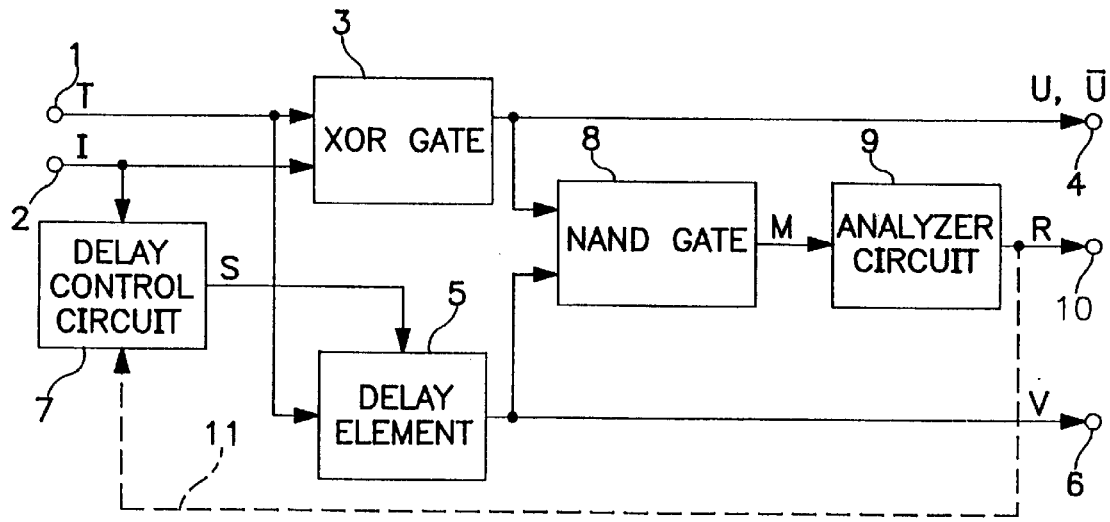
FIG. 1
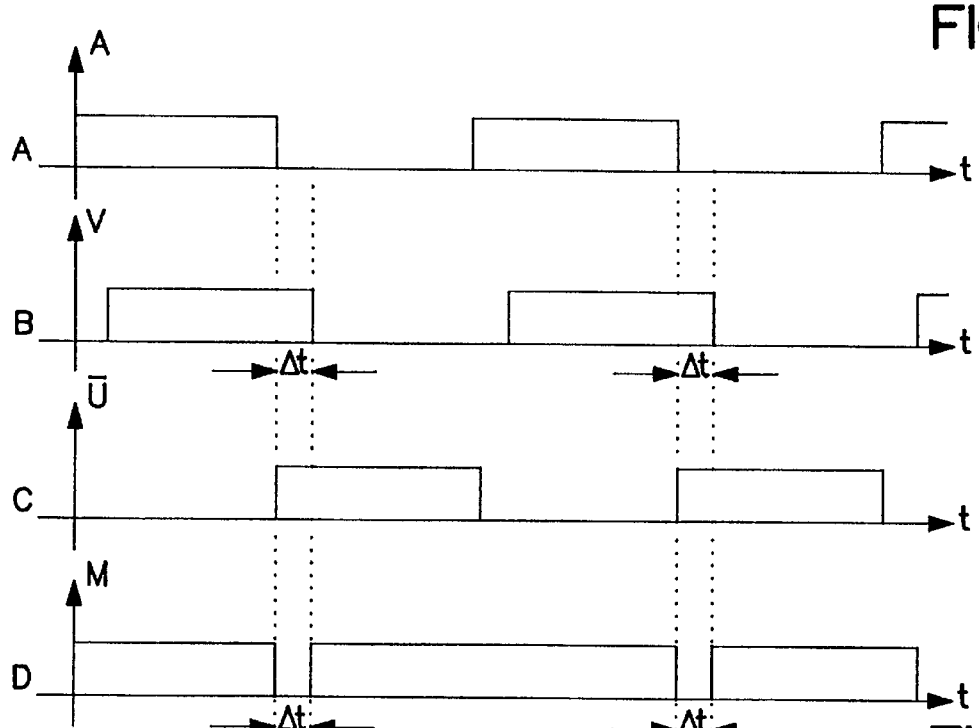
FIG. 2
| | I | T | U | Ū |
|---|---|---|---|---|
| NP | 0 | 0 | 0 | X |
| | 0 | 1 | 1 | X |
| MP | 1 | 0 | X | 1 |
| | 1 | 1 | X | 0 |
FIG. 3

CIRCUIT ARRANGEMENT FOR GENERATING TWO SIGNALS STAGGERED IN TIME FROM A CLOCK SIGNAL AND FOR MEASURING THEIR TIME STAGGER

BACKGROUND OF THE INVENTION

1. Field of the Invention

The invention relates to a circuit arrangement for generating two signals staggered in time from a clock signal and for measuring their time stagger. The circuit arrangement comprises an input to which the clock signal is applied, a first output at which an undelayed signal generated from the clock signal is delivered, a second output at which a signal generated from the clock signal and delayed relative to the undelayed signal is delivered and a delay time measuring arrangement for measuring the time stagger between the delayed signal and the undelayed signal.

2. Description of the Prior Art

A prior art circuit arrangement of this kind comprises two inverters connected in series between the input of the circuit arrangement and the first output of the circuit arrangement. The delay time measuring arrangement comprises a NAND gate which receives at one input the delayed signal and at the other input the output signal of the first inverter which is the inverted clock signal. The NAND gate furnishes an output signal which depends on the time stagger existing between the two input signals of the NAND gate. The first inverter is needed because the output signal of the NAND gate represents the time stagger between two signals only when one of the two signals is inverted. The second inverter is needed for reconverting the inverted clock signal to its original form so that it can be used as an undelayed signal together with the delayed signal.

One problem particular to this prior art circuit arrangement resides in the fact that the time stagger determined from the output signal of the NAND gate does not correspond to the actual time stagger between the signals occuring at the two outputs of the circuit arrangement. The reason for this is that the undelayed signal appearing at the first output of the circuit arrangement is affected with the transit delay occuring in the second inverter needed for reconverting the signal, but this transit delay cannot be sensed by the NAND gate since the second inverter is located downstream of the circuit point at which the inverted clock signal is branched off to the NAND gate. This is the reason why there is an uncertainty as to the time stagger actually existing between the two signals appearing at the two outputs of the circuit arrangement, which uncertainty cannot be removed in the prior art circuit arrangement. This drawback is particularly serious when an extremely small and precisely defined time stagger needs to be achieved between the two signals.

SUMMARY OF THE INVENTION

The object of the invention is to provide a circuit arrangement of the aforementioned kind with which the actual time stagger between the signals appearing at the two outputs of the circuit arrangement can be precisely determined.

According to the invention this object is achieved by a circuit arrangement for generating two signals staggered in time from a clock signal and for measuring their time stagger, comprising an input to which the clock signal is applied, a first output at which an undelayed signal generated from said clock signal is delivered, a second output at which a signal generated from said clock signal and delayed relative to said undelayed signal is delivered, and a delay time measuring arrangement comprising an inverter connected between the input of the circuit arrangement and the first output of the circuit arrangement and a NAND gate, said NAND gate receiving at one input said delayed signal and at the other input the output signal of said inverter and furnishing an output signal for determining the time stagger existing between said undelayed signal and said delayed signal, wherein said inverter is a reversible inverter which can be switched by a switching signal between a non-inverting condition in a working phase and an inverting condition in a measuring phase.

The reversible inverter employed according to the invention renders the second inverter, used hitherto and not translating into the measurement, superfluous. By the switching signal applied to an input of the reversible inverter, the operation of the circuit arrangement is divided into a working phase and a measuring phase. In the measuring phase, the reversible inverter takes over the task of inverting the clock signal applied to the input of the circuit arrangement, as it is required for the measuring function of the NAND gate whilst in the working phase the clock signal passes through the reversible inverter without being inverted so that it can be used as the undelayed signal together with the delayed signal. In both phases the clock signal applied to the input of the circuit arrangement thus passes through the reversible inverter which in both phases causes the same time delay in the clock signal before it attains the first output of the circuit arrangement. As a result, the time stagger measured in the measuring phase with the aid of the NAND gate is equal to the wanted actual delay existing in the working phase between the staggered signals appearing at the outputs of the circuit arrangement. Thus, a measurement indicative of the actual time stagger between the signals existing at the outputs of the circuit arrangement is achieved, which measurement takes into account the delays caused by all active components through which the signals pass prior to attaining the two outputs of the circuit arrangement.

BRIEF DESCRIPTION OF THE DRAWINGS

Further features and advantages of the invention read from the following description of an example embodiment with reference to the drawings, in which:

FIG. 1 is a block diagram of an example embodiment of a circuit arrangement in accordance with the invention for generating two signals staggered in time from a clock signal and for measuring their time stagger, FIG. 2 comprises four signal diagrams for explaining the operation of the example embodiment as shown in FIG. 1, and FIG. 3 is a truth table for explaining the function of the XOR gate used as a reversible inverter in the example embodiment as shown in FIG. 1.

DESCRIPTION OF THE PREFERRED EMBODIMENT

FIG. 1 of the drawing shows an example embodiment of the circuit arrangement in accordance with the invention for generating two signals staggered in time from a clock signal and for measuring their time stagger.

A clock signal T having a predetermined clock frequency is applied to a first input 1 of the circuit arrangement, and a binary switching signal I is applied to a second input 2. The first input 1 of the circuit arrangement is connected to one input of an XOR gate 3, and the second input 2 is connected to the other input of the XOR gate 3. The output of the XOR gate 3 is connected to a first output 4 of the circuit arrangement. The XOR gate 3 forms an inverter for the clock signal T, this inverter being reversible between an inverting condition for I=1 and a non-inverting condition for I=0. The XOR gate 3 causes an intrinsic transit delay of small magnitude which does not depend on the logic value of the switching signal I so that the clock signal T for I=0 requires the same time as for I=1 to pass through the XOR gate 3. The clock signal T is branched off from the connection between the first input 1 and the XOR gate 3 to a second circuit branch in which it is supplied to a delay element 5 via which it gains access in a delayed form to a second output 6 of the circuit arrangement. The delay caused by the delay element 5 can be varied by means of a delay control signal S which is supplied to the delay element 5 from a delay control circuit 7. This delay is greater than the intrinsic transit delay caused by the XOR gate 3 so that the output signal of the delay element 5 is delayed relative to the output signal of the XOR gate 3 by a delay time $\Delta t$. In the following description the output signal of the XOR gate 3 appearing at the first output 4 of the circuit arrangement is called the undelayed signal U and the output signal of the delay element 5 appearing at the output 6 of the circuit arrangement is called the delayed signal V. Thus, the signals U and V, which are derived from the same clock signal T, are staggered in time or time-shifted, and their time stagger or time-shift is equal to the delay time $\Delta t$.

For measuring the time stagger $\Delta t$ actually existing between the signals U and V a NAND gate 8 is provided, the one input of which is connected to the output of the XOR gate 3 and the other input of which is connected to the output of the delay element 5. The output signal M of the NAND gate is applied to an analyzer circuit 9 which furnishes an output signal R which is supplied to a measurement output 10 of the circuit arrangement.

The operation of the circuit arrangement as shown in FIG. 1 will now be explained with reference to FIGS. 2 and 3.

The circuit arrangement can be operated in two phases, a working phase NP and a measuring phase MP, the one excluding the other. The working phase NP is determined by the fact that the binary switching signal I applied to the first input of the XOR gate 3 is logic 0 so that the XOR gate 3 is in the non-inverting condition. As evident from the truth table shown in FIG. 3, the clock signal T then passes through the XOR gate 3 to the first output 4 of the circuit arrangement without being inverted. The signal diagram A of FIG. 2 shows the undelayed signal U which is applied in the working phase NP to the first output 4 of the circuit arrangement. This signal corresponds to the clock signal T apart from the slight intrinsic transit delay caused by the XOR gate 3. In the illustrated example the clock signal T is composed of rectangular pulses separated by spaces having the same duration as the pulses. The signal diagram B of FIG. 2 shows the signal V applied to the second output 6 of the circuit arrangement in both the working phase NP and the measuring phase MP. This signal, too, has the shape of the clock signal T but is staggered in time relative to the signal U by the delay time $\Delta t$ caused by the delay element 5 so that the following equation applies:

$$V(t)=U(t-\Delta t) \quad (1)$$

In the working phase NP it is possible to make use of the undelayed signal U appearing at the first output 4 of the circuit arrangement together with the delayed signal V appearing at the second output 6 of the circuit arrangement. Thus, for example, the edges of the two signals U and V can be used to trigger actions required to begin at a desired time spacing from each other. To this end the time stagger between the signals U and V must be precisely known and, if necessary, corrected. In the circuit arrangement of FIG. 1, the delay time $\Delta t$ is dictated primarily by the delay control signal S by which the delay control circuit 7 prescribes a set-point value $\Delta t_s$ for the time delay in the delay element 5. This set-point value, of course, also takes into account the known intrinsic transit delay of the XOR gate 3. The time stagger actually materializing between the signals U and V fails to agree as a rule with this prescribed set-point value $\Delta t_s$, however, due to dispersions in the parameters of the components, temperature changes and other influences. In addition, it may be that the relation between the delay control signal S and the delay time set by this control signal in the delay element 5 is not linear or is not precisely known. All of these additional influencing factors can be grouped together in a term $\Delta t_a$ which describes the deviation between the set-point value $\Delta t_s$ and the actual time stagger $\Delta t$ between the signals U and V, and thus:

$$\Delta t = \Delta t_s \pm \Delta t_a \quad (2)$$

In the circuit arrangement of FIG. 1, the time stagger $\Delta t$ between the signals U and V is measured by means of the NAND gate 8. In the working phase NP, however, measuring the time stagger $\Delta t$ by means of the NAND gate 8 is not possible, because the NAND gate 8 only furnishes an output signal indicating the time stagger between the undelayed signal U and the delayed signal V when one of the two signals exists in the inverted form.

This is why, for determining the time stagger $\Delta t$ occuring in the working phase NP between the signals U and V, a measuring phase MP is introduced which is determined by the fact that the binary switching signal I applied to the XOR gate 3 is logic 1, so that the XOR gate 3 is in the inverting condition. As evident from the truth table shown in FIG. 3 the XOR gate 3 then acts as an inverter for the clock signal T coming from the input 1. The inverted output signal $\overline{U}$ of the XOR gate 3 is shown in the signal diagram C of FIG. 2. This inverted output signal $\overline{U}$ is subject to the same intrinsic transit delay of the XOR gate 3 as the non-inverted signal U in the working phase NP.

In the measuring phase MP the NAND gate 8 receives the delayed signal V at one input and the inverted undelayed signal $\overline{U}$ at the other input. The signal diagram D of FIG. 2 shows the output signal M of the NAND gate 8 in the measuring phase MP. The wanted actual time stagger $\Delta t$ results from the gaps in the signal M, the duration of each gap being equal to the time stagger $\Delta t$ which exists between the signal V and the non-inverted signal U in the working phase NP. It is also evident that the NAND gate 8 only furnishes a useful output signal M when the time-shift in the two signals relative to each other is smaller than the duration of a clock pulse.

The output signal M of the NAND gate 8 is applied to the analyzer circuit 9 which generates from the output signal M an output signal R proportional to the time-stagger $\Delta t$ existing between the signals U and V appearing at the two outputs 4 and 6 of the circuit arrangement in the working phase NP. This can be achieved e.g. by the analyzer circuit 9 inverting the output signal M and subsequently integrating the inverted signal. The output signal R of the analyzer circuit 9 is available at the measurement output 10 of the circuit arrangement in the measuring phase MP.

The output signal R of the analyzer circuit 9 can also be supplied to the delay control circuit 7 as indicated by the broken line 11 from the output of the analyzer circuit 9 to the delay control circuit 7 in FIG. 1, as a result of which the control voltage signal S can be corrected so that a desired time stagger is achieved. In this case the NAND gate 8, the analyzer circuit 9, the delay control circuit 7 and the delay element 5 form a closed loop control circuit serving to automatically correct departures from the desired time stagger. The output signal R of the analyzer circuit 9 may, however, only be employed in the measuring phase MP for correction since it fails to represent any measure for the time stagger in the working phase NP. This is the reason why the delay control circuit 7 in this case is controlled additionally by the switching signal I which determines the switching between the measuring phase MP and the working phase NP. This is indicated by the arrow leading from the input 2 to the delay control circuit 7 in FIG. 1. When the switching signal I is logic 1, determining the measuring phase MP, it enables the correction of the delay time prescribed by the control signal S so that it assumes the desired value which is then maintained by the control signal S also in the working phase NP. When the switching signal I is logic 0, determining the working phase NP, it blocks the correcting influence of the output signal R of the analyzer circuit 9 on the control signal S which then maintains the set-point value determined in the predceding measuring phase MP.

Switching from the working phase NP to the measuring phase MP may be done in time intervals which are selected so that each measuring phase does not interfere with the use of the staggered signals U and V in the working phases NP.

The circuit arrangement is able to satisfy the function in accordance with the invention also when an inverting delay element 5 is used. This merely requires that the allocation of the logic states of the switching signal I to the two phases NP and MP is reversed so that in the working phase NP a logic 1 switching signal is applied and in the measuring phase MP a logic 0 switching signal is applied.

The XOR gate 3 may be replaced by any other reversible inverter permitting switching between an inverting condition and a non-inverting condition and in which the time required by the clock signal to pass through the inverter is the same in both conditions.

What is claimed is:

1. A circuit arrangement for generating two signals staggered in time from a clock signal and for measuring their time stagger, comprising an input to which said clock signal is applied, a first output at which an undelayed signal generated from said clock signal is delivered, a second output at which a delayed signal generated from said clock signal is delivered, said delayed signal being delayed relative to said undelayed signal, a reversible inverter which is switched by a switching signal between a non-inverting condition in a working phase and an inverting condition in a measuring phase, said reversible inverter being connected between said input of the circuit arrangement and said first output of the circuit arrangement, and a NAND gate having two inputs and an output, said NAND gate receiving at one input said delayed signal and at the other input the output signal of said reversible inverter, and, in said measuring phase, said NAND gate generating a measuring signal at said NAND gate output indicative of the time stagger existing between said undelayed signal and said delayed signal.

2. The circuit arrangement as set forth in claim 1, wherein said reversible inverter comprises an XOR gate, said XOR gate receiving at one input said clock signal and at the other input said switching signal.

3. The circuit arrangement as set forth in claim 1, wherein said delayed signal is generated by a delay element connected between the input of said circuit arrangement and the second output of said circuit arrangement.

4. The circuit arrangement as set forth in claim 1, wherein said delayed signal is generated by a delay element connected between the input of said circuit arrangement and the second output of said circuit arrangement and the second output of said circuit arrangement, and wherein a setpoint value for the delay time between said undelayed signal and said delayed signal can be variably adjusted at said delay element by a delay control signal.

5. The circuit arrangement as set forth in claim 1, further comprising an analyzer circuit having an analyzer input coupled to said NAND gate output, wherein, in said measuring phase, said analyzer circuit generates a time-stagger signal from said measuring signal, said time-stagger signal being proportional to the time stagger existing between said undelayed signal and said delayed signal.

6. The circuit arrangement as set forth in claim 5, wherein said delayed signal is generated by a delay element connected between said input of said circuit arrangement and said second output of said circuit arrangement, a set-point value for the delay time between said undelayed signal and said delayed signal is variably adjusted at said delay element by a delay control signal, and said time-stagger signal is used to adjust said delay control signal in said measuring phase so that departures from said set-point value are automatically corrected.

7. The circuit arrangement as set forth in claim 2, wherein said delayed signal is generated by a delay element connected between the input of said circuit arrangement and the second output of said circuit arrangement.

8. The circuit arrangement as set forth in claim 2, wherein said delayed signal is generated by a delay element connected between the input of said circuit arrangement and the second output of said circuit arrangement and the second output of said circuit arrangement, and wherein a setpoint value for the delay time between said undelayed signal and said delayed signal can be variably adjusted at said delay element by a delay control signal.

* * * * *